US009000837B1

United States Patent
Fifield

(10) Patent No.: US 9,000,837 B1
(45) Date of Patent: Apr. 7, 2015

(54) ADJUSTABLE REFERENCE VOLTAGE GENERATOR FOR SINGLE-ENDED DRAM SENSING DEVICES

(71) Applicant: International Business Machines Corporation, Armonk, NY (US)

(72) Inventor: John A. Fifield, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/072,321

(22) Filed: Nov. 5, 2013

(51) Int. Cl.
G05F 1/10 (2006.01)
G05F 5/00 (2006.01)

(52) U.S. Cl.
CPC .......................................... *G05F 5/00* (2013.01)

(58) Field of Classification Search
USPC .......... 323/304, 311; 327/306, 331, 332, 538, 327/540–543; 365/226, 228
See application file for complete search history.

(56) References Cited

U.S. PATENT DOCUMENTS

| 4,613,957 | A | * | 9/1986 | Iwahashi | 365/189.05 |
| 5,764,175 | A | * | 6/1998 | Pan | 341/161 |
| 6,208,127 | B1 | | 3/2001 | Doluca | |
| 6,650,173 | B1 | | 11/2003 | Khouri et al. | |
| 6,771,200 | B2 | | 8/2004 | Frulio et al. | |
| 7,218,168 | B1 | * | 5/2007 | Rahman | 327/540 |
| 8,253,396 | B2 | | 8/2012 | Tanzawa | |
| 8,400,212 | B1 | | 3/2013 | Nguyen et al. | |
| 8,848,426 | B2 | * | 9/2014 | Azuma et al. | 365/148 |
| 2008/0043513 | A1 | * | 2/2008 | Hoenigschmid et al. | 365/148 |
| 2010/0109435 | A1 | | 5/2010 | Ahmadi et al. | |
| 2011/0141827 | A1 | | 6/2011 | Mozak et al. | |
| 2012/0063254 | A1 | | 3/2012 | Hsia et al. | |
| 2013/0215686 | A1 | | 8/2013 | Anand et al. | |
| 2014/0293715 | A1 | | 10/2014 | Barth, Jr. et al. | |

* cited by examiner

*Primary Examiner* — William Hernandez
(74) *Attorney, Agent, or Firm* — David Cain; Roberts Mlotkowski Safran & Cole, P.C.

(57) ABSTRACT

Methods, systems, and structures for generating a target reference voltage are provided. A circuit includes a voltage adjuster, a switch, and a current source. The switch selectively connects the current source to circuit paths in the voltage adjuster. A first of the circuit paths incrementally decreases the target reference voltage with respect to the input voltage. A second of the circuit paths incrementally increases the target voltage with respect to the input voltage.

20 Claims, 9 Drawing Sheets

ADJUSTABLE REFERENCE VOLTAGE GENERATOR FOR SINGLE-ENDED DRAM SENSING DEVICES

FIELD OF INVENTION

The present disclosure relates to sense circuits for memory devices. More particularly, the disclosure relates to compensating a switch point voltage of a single-ended sense amplifier in a dynamic random-access memory (DRAM).

BACKGROUND

In conventional DRAM, a sense signal from a memory cell is generated by sharing the charge stored in the memory cell with a pre-charged bit line, and then the voltage of the sense signal is compared to that of a reference voltage. The sense signal on the bit line is interpreted as being in a "low" state or a "high" state to determine a "0" or a "1" digital logic output. The reference voltage level is centered between the expected voltage bands of the "low" state and the "high" state. A comparator compares the reference voltage level to the bit line to interpret the sense signal and output the corresponding digital logic level.

Some types of DRAM, such as embedded DRAM (eDRAM), use single-ended sense schemes to interpret whether a sense signal on a bit line is "high" or "low". Single-ended sense schemes do not include a reference voltage level for comparison. Instead, the bit line is directly coupled to a sense device (e.g., a sensing inverter) that has a switch-point voltage which varies from the midpoint of the "high" and "low" states of the sense signal. The bit line is pre-charged to a voltage such that when the bit line is coupled with a sense signal, the sense signal pulls the voltage of the bit line above or below the switch-point voltage, which is interpreted by the sense device as a "0" or a "1."

Ideally, the switch-point voltage of every single-ended sense device in a DRAM would be the same. However, in reality, the switch-point voltage of individual single-ended sense devices can be different due to, for example, manufacturing variations and/or operational parameters (e.g., NFET and PFET Vt, transconductance, temperature, and supply voltage). As such, the output of a particular single-ended sense device can change independently of the voltage level of the bit line. Unlike differential sense schemes, which use a reference voltage level, the switch-point voltage of single-ended sense devices cannot be adjusted. In other words, the ability to center the switch-point voltage on the expected voltage bands of the "low" and "high" states is lost, which makes it difficult to design and test DRAM having single-ended sense devices for high yield, maximum retention, and reliability.

Conventional methods for implementing single-ended sense devices attempt to predict the switch-point voltages. For example, during circuit design, design engineers may estimate the switch point voltages based on parasitic capacitance on bit line structures, the input capacitance of the sense devices, and the leakage incurred on the stored charge in the DRAM cells. These values can be predicted during design of the integrated circuit to calculate a value for the bit line voltage. However, these predictions are approximations that may not be accurate for all DRAMs produced in a batch and, thus, may result in the loss of production yield when the switch-point voltage a particular DRAM is outside an acceptable range.

SUMMARY

In an aspect of the invention, there is a circuit for generating a target reference voltage. The circuit includes a voltage adjuster, a switch, and a current source. The switch selectively connects the current source to circuit paths in the voltage adjuster. A first of the circuit paths incrementally decreases the target reference voltage with respect to the input voltage. A second of the circuit paths incrementally increases the target voltage with respect to the input voltage.

In another aspect of the invention there is a circuit for a DRAM including devices configured to increase and decrease a reference voltage provided to a single-ended sense device of a memory cell array. The devices include an operational amplifier coupled to a current source having selectable current increments. The operational amplifier increases or decreases the reference voltage based on the current increments that are selected.

In another aspect of the invention there is a method including determining a difference between a switch-point voltage and an input voltage of a single-ended sense device. The method also includes determining a voltage increment for the input voltage based on the difference. The method further includes adjusting the input voltage based on the voltage increment.

In another aspect of the invention, a design structure tangibly embodied in a machine readable storage medium for designing, manufacturing, or testing an integrated circuit is provided. The design structure comprises structures associated with a predefined minimum feature size and a predefined minimum spacing size. In further embodiments, a hardware description language (HDL) design structure encoded on a machine-readable data storage medium comprises elements that when processed in a computer-aided design system generates a machine-executable representation of the integrated circuit chip of the present invention. In still further embodiments, a method in a computer-aided design system is provided for generating a functional design model of the integrated circuit chip of the present invention. The method comprises generating a functional representation of the structural elements of the integrated circuit chip of the present invention.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The present disclosure relates to sense circuits for semiconductor devices. More particularly, the disclosure relates to compensating for a switch-point voltage of a single-ended sense amplifier in a DRAM. A sense circuit for a DRAM in accordance with aspects of the present invention adjusts pre-charged levels of bit lines higher and lower to center the bit line voltage on the switch-point voltage of a single-ended sense device. In embodiments, the sense circuit includes a combination of digital and analog devices that provide a selectable reference voltage that can be correspondingly higher and lower than a bit line source voltage. Thus, the present invention advantageously compensates for variations that affect the interpretation "0" and "1" logic levels of single-ended sense devices (e.g., process variations, operational conditions, array leakage mechanisms, write back inefficiencies, noise, and the like).

Figure 1:
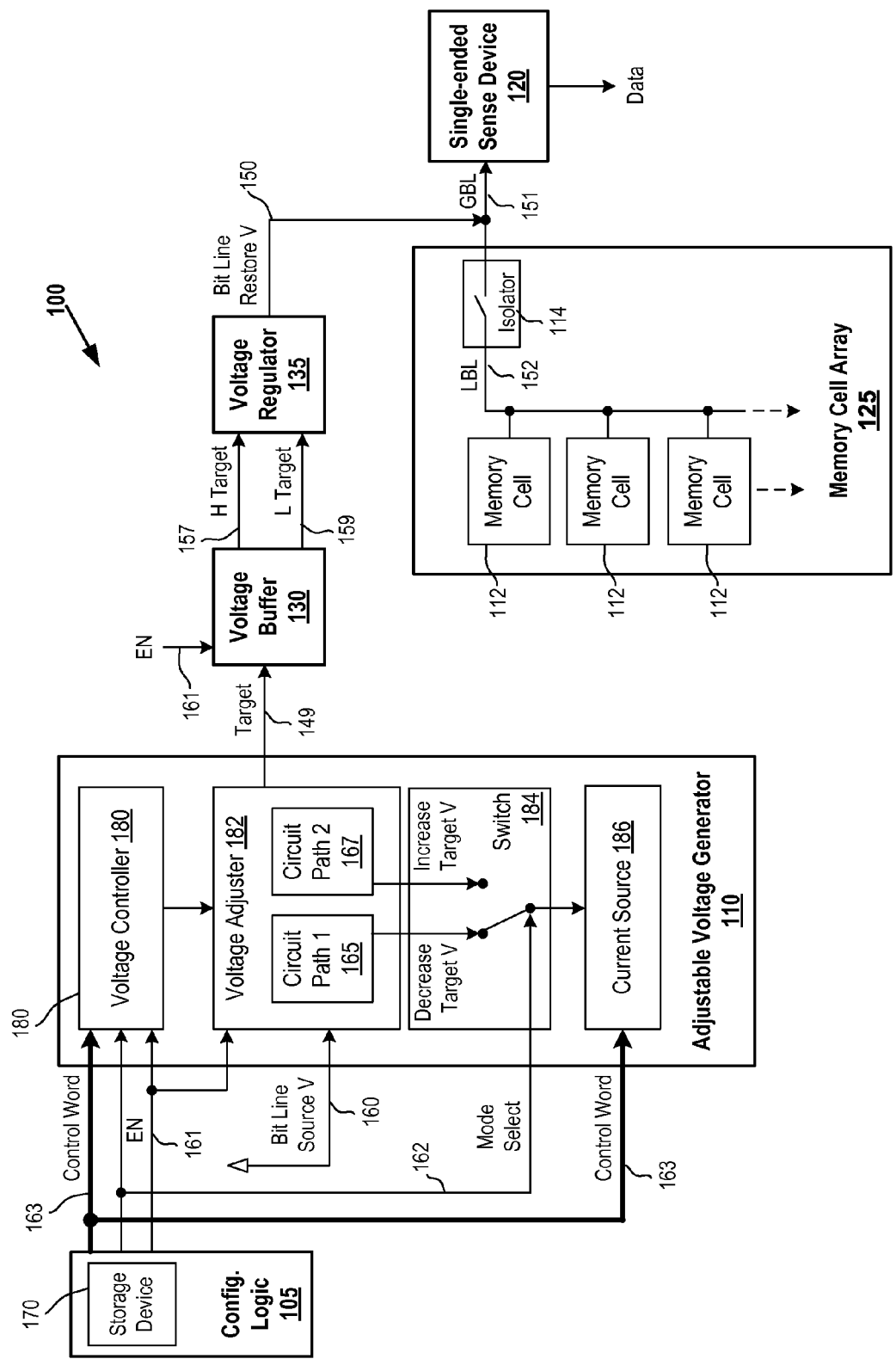
FIG. 1 shows a block diagram of an exemplary DRAM in accordance with aspects of the present invention.

FIG. 1 shows a block diagram of an exemplary DRAM 100 in accordance with aspects of the present invention. As shown in FIG. 1, DRAM 100 may include configuration logic 105, an adjustable voltage generator 110, a single-ended sense device 120, a memory cell array 125, a voltage buffer 130, and a voltage regulator 135. In embodiments, the configuration logic 105 controls the adjustable voltage generator 110 to produce a target voltage 149. This voltage is used to generate a bit line restore voltage 150 that pre-charges a global bit line 151 (i.e., "GBL") to a level that is the same as a switch-point voltage of the single-ended sense device 120. That is, the voltage buffer 130 receives the target voltage 149 produced by the adjustable voltage generator 110 and outputs a high target voltage 157 (i.e., H Target V) and low target voltage 159 (i.e., L Target V"). In embodiments, the high target voltage 157 is equal to the target voltage 149 and the low target voltage 159 at an offset below the high target voltage 157 by a predetermined amount (e.g., 20 mV less). The voltage regulator 135 receives the high target voltage 157 and the low target voltage 159, and uses them to generate the bit line restore voltage 150, which is at the midpoint of the high target voltage 157 and the low target voltage 159.

In aspects of the invention, the sense device 120 is a single-ended sense device that has a single data input connected to the global bit line 151, which links the sense device 120 to the memory cell array 125. The sense device 120 can be, for example, an amplifier, an inverter, a comparator, or the like that outputs either a low or a high e.g., "0" or a "1" digital logic. As is conventional, the sense device 120 switches between "0" and a "1" when the voltage of the global bit line 151 is below or above a switch-point voltage (e.g., 0.5V) of the sense device 120.

In embodiments, the memory cell array 125 includes a plurality of memory cells 112 tied to a common local bit line 152 (i.e., "LBL") and an isolator 114. In accordance with aspects of the invention, the memory cells 112 can be eDRAM memory cells that are embedded on a single semiconductor die. It should be noted that FIG. 1 shows three memory cells 112 for the sake of example. However, DRAM arrays in embodiments of the present invention can include a greater number of memory cells 112. For example, the memory cells 112 can be arranged along 64 word lines, wherein groups of the 64 bit-cells of the memory cell array 125 are connected to corresponding sense devices 120 via respective local bit lines.

The isolator 114 is a device (e.g., a CMOS switch) that disconnects the local bit line 152 from the global bit line 151 when, for example, none of the memory cells 112 in memory cell array 125 are being read. Before information is read from the memory cell array 125, the isolator 114 disconnects the local bit line 152 from the global bit line 151, and the global bit line 151 is pre-charged to the bit line restore voltage 150, (which is based on the target voltage 149 output by the adjustable voltage generator 110). When a value stored in one of the memory cells 112 is read, the memory cell array 125 controls the isolator 114 to connect the local bit line 152 to the global bit line 151. In addition, the memory cell array 125 connects a selected one of the memory cells 112 to the local bit line 152. After information is read from the memory cell array 125, the global bit line 151 is restored to a voltage that centers the "high" and "low" data levels of the memory cells 112 on either side of the switch-point voltage of the sense device 120 by the bit line restore voltage 150.

In accordance with aspects of the present invention, the bit line restore voltage 150 is set based on the configuration logic 105 such that when isolator 114 is conducting, the charge on the local bit line 152 combined with the charge on the global bit line 151 will develop a voltage which is the same as a switch-point voltage of the sense device 120. For example, where the switch point of the single-ended switch device is 0.5V, the bit line restore voltage 150 is selected such that the band of "high" state voltages and the band of "low" state voltage are centered around 0.5V.

Accordingly, the adjustable voltage generator 110 can be set by the configuration logic 105 to output a target voltage 149 such that the bit line restore voltage 150 is set to a voltage level that when charge stored on the global bit line 151 is shared with the charge stored on the local bit line 152, the voltage on the global bit line 151 resulting from their combination is at the switch-point voltage of the sense device 120 (e.g., 0.5V). When one of the memory cells 112 is read, the voltage developed on the respective local bit line 152 pulls the pre-charged voltage of the global bit line (e.g., 0.5V) lower or higher. The sense device 120 outputs a logic low or logic high value (e.g., "0" or "1") corresponding to the change in the voltage of the global bit line 151 due to the voltage read from one of the memory cells 112. However, as noted herein, the switch-point voltage of single-ended sense devices may vary from device-to-device due to manufacturing process variations and/or environmental conditions. Thus, for example, the switch-point voltage of the sense device 120 may be 0.45 V. In such case, if the bit line restore voltage 150 is set to result in a 0.5 V precharge level, a "low" voltage stored in one of the memory cells 112 may fail to pull the voltage of the global bit line 151 below 0.45 V. In such a situation, the stored value of the memory cell 112 would not be interpreted as "low", but instead would be misinterpreted as being "high." Thus, in accordance with aspects of the invention, the adjustable voltage generator 110 is controlled to selectively increase or decrease the bit line restore voltage 150 to center the "high" and "low" data bands on the switch-point voltage of the sense device 120 (e.g., 0.45 V) based on the results of electrical testing of a physical device (rather than approximating it using modeling and simulation).

According to aspects of the invention, the bit line restore voltage 150 can be set during initial, post-production configuring of the DRAM 100 to tune the bit line restore voltage 150 to center the expected data bands at the switch-point voltage of sense device 120. Additionally or alternatively, the bit line restore voltage 150 can be set after installation of the DRAM 100 in a system to center the data bands at the switch-point voltage of the sense device 120 based on operating conditions of the system (e.g., temperature, etc.). In embodiments, the voltage level of the bit line restore voltage 150 is determined by signal margin testing of the memory cell array 125. For example, a power supply voltage can be adjusted to its minimum and/or maximum value and the operating temperature can be raised, and/or lowered to its upper and lower values creating a matrix of for tests. The voltage value of the bit line restore voltage 150 can be adjusted through a range as each of the memory cells is tested for correct retention of "1" and "0" data types. Pass/fail maps can be made by overlapping a number of tests and the bit line restore voltage 150 can be centered at a point giving test margin to all tests.

Still referring to FIG. 1, the configuration logic 105 may be one or more devices that control the adjustable voltage generator 110 to adjust the bit line restore voltage 150. In embodiments, the configuration logic 105 is connected to the adjustable voltage generator 110 and provides it with several signals including an enable signal 161 (i.e., EN), a mode select signal 162, and a control word signal 163. The enable signal 161 is one or more signals that selectively enables/disables the adjustable voltage generator 110 when, for example, its function is not necessary (e.g., during a test mode). The mode select signal 162 controls the adjustable voltage generator 110 to switch between a first mode, in which the target voltage 149 is decreased, and a second mode, in which the target voltage 149 is increased. The control word signal 163 selectively controls the offset of the target voltage 149 from a bit line source voltage 160 (e.g., ±0.25 mV, ±0.50 mV, ±0.75 mV, . . . ±5.0 mV). The control word signal 163 can be a digital signal (e.g., a 4-bit digital logic word) whose value controls the output of the adjustable voltage generator 110 based on the control word signal 163. As shown in FIG. 1, the configuration logic 105 resides in the DRAM 100. However, some or all of the elements of the configuration logic 105 can be elsewhere. For example, a system (e.g., computing device or test bench) in which the DRAM 100 is installed may incorporate some are all of the configuration logic 105.

In embodiments, configuration logic 105 includes a nonvolatile data storage device 170 (e.g. a fusible memory device) that stores values for the mode select signal 162 and a control word signal 163. For example, based on the switch-point voltage of the singled-ended sense device 120 determined from post-manufacturing electrical testing of the DRAM 100, an individual (e.g., a test and evaluation engineer) or an automated program can store values for the enable signal 161, the mode select signal 162 and/or control word signal 163 in the storage device 170 of the configuration logic 105 to control the bit line restore voltage 150. Additionally or alternatively, based on the switch-point voltage determined from monitoring operational conditions (e.g., temperature) of the DRAM during operation in a fielded system, an individual or an automated program can change the values for the enable signal 161, the mode select signal 162 and/or control word signal 163 in the storage device 170.

In embodiments, the adjustable voltage generator 110 is a device or a combination of devices that outputs the target voltage 149, which is higher or lower than the bit line source voltage 160. Based on the mode select signal 162 and the control word signal 163, the adjustable voltage generator 110 can increase and decrease the bit line source voltage 160 to produce the target voltage 149. The bit line source voltage 160 can be provided to the adjustable voltage generator 110 from a bandgap reference voltage source.

With continued reference to FIG. 1, the adjustable voltage generator can include a voltage controller 180, a voltage adjuster 182, a switch 184, and a current source 186. The voltage controller 180 includes one or more devices that control the operation of the voltage adjustor 182 to keep it in an optimal operating range under different current draws by the current source 186 based on the enable signal 164 and the content of the control word 163. In embodiments, the voltage controller 180 selectively controls the voltage adjustor 182 to improve the linearity of the target voltage 149 output by the adjustable voltage generator 110 under different operating conditions. For example, when current source 186 draws a large amount of current in order to increase the target voltage 149, the voltage controller 180 can selectively configure the voltage adjuster 182 such that analog elements (e.g., an amplifier and output transistors) operate linearly.

The voltage adjuster 182 is one or more devices that generate the target voltage 149 at a level that is above or below the level of the bit line source voltage 160. The target voltage 149 is then used by the voltage buffer 130 and the voltage regulator 135 to generate the bit line restore voltage 150, which pre-charges the global bit line 151 to a level that will center the band of "high" and "low" data levels to the switch-point voltage of the single-ended sense device 120. In accordance with aspects of the invention, the voltage adjuster 182 includes a first circuit path 165 (i.e., "circuit path 1") and a second circuit path 167 (i.e., "circuit path 2") that, when selected by the switch 184, control the voltage adjuster 182 to respectively decrease or increase the target voltage 149.

The switch 184 is one or more devices that alternately select one of two states based on the mode select signal 162. In the first state (i.e., "Decrease Target V"), the switch 184 connects the first circuit path 165 of the voltage adjuster 182 to the current source 186 such that current drawn by the current source 186 decreases the target voltage 149 output by the voltage adjuster 182. In the second state (i.e., "Increase Target V"), the switch 184 connects the second circuit path 167 of the voltage adjuster 182 to the current source 186 such that current drawn by the current source 186 increases the target voltage 149 output by the voltage adjuster 182.

The current source 186 includes one or more devices that incrementally adjust the value of the target voltage 149 based on the control word signal 163. That is, the information included in the control word signal 163 selectively controls the amount current drawn by the current source 186 from the voltage adjuster 182. In embodiments, the control word signal 163 selects one of a predetermined number of current levels provided by the current source 186. For example, the current source 186 may include a number of different current paths that can be progressively activated to provide incremental increases in current flow from the voltage adjuster 182 via either the first circuit path 165 or the second circuit path 167.

The voltage buffer 130 and the voltage regulator 135 use the target voltage 149 to generate the bit line restore voltage 150 in accordance with aspects of the invention. The voltage buffer 130 receives the target voltage 149 to isolate the adjustable voltage generator 110 from the voltage regulator 135. The voltage buffer 130 outputs the high target voltage 157 and the low target voltage 159. The high target voltage 157 and the low target voltage 159 provide upper and lower limit reference voltages to the voltage regulator 135, which generates the bit line restore voltage 150. That is, the voltage regulator 135 keeps the bit line restore voltage 150 within a regulated range (e.g., 20 mV). As the high target voltage 157 and the low target voltage 159 are adjusted above and below the bit line source voltage 150, the voltage regulator 135 provides the bit line restore voltage 150, which can be adjusted to increase the sense margin of a "1" over a "0" logic or vice versa.

The components of the DRAM 100, including the configuration logic 105, the adjustable voltage generator 110, the single ended sense device 120, the memory cell array 125, the voltage buffer 130, the voltage regulator 135, and their respective components, are shown in FIG. 1 as discrete units. It will be understood that this depiction is a functional representation for the sake of example. Embodiments of the DRAM 100 are not limited to the divisions depicted in FIG. 1, and the components can be organized differently. For example, the adjustable voltage generator 110, the voltage buffer 130, and/or the voltage regulator 135 can be combined into a single unit. Further, the voltage controller 180, voltage adjuster 182, the switch 184, and/or the current source 186 can be divided from the adjustable voltage generator 110 into separate units, for example. Further, as noted above, the configuration logic 105 need not be included in the DRAM 100 and, instead, can be part of a system in which the DRAM 100 is installed.

Figure 2:
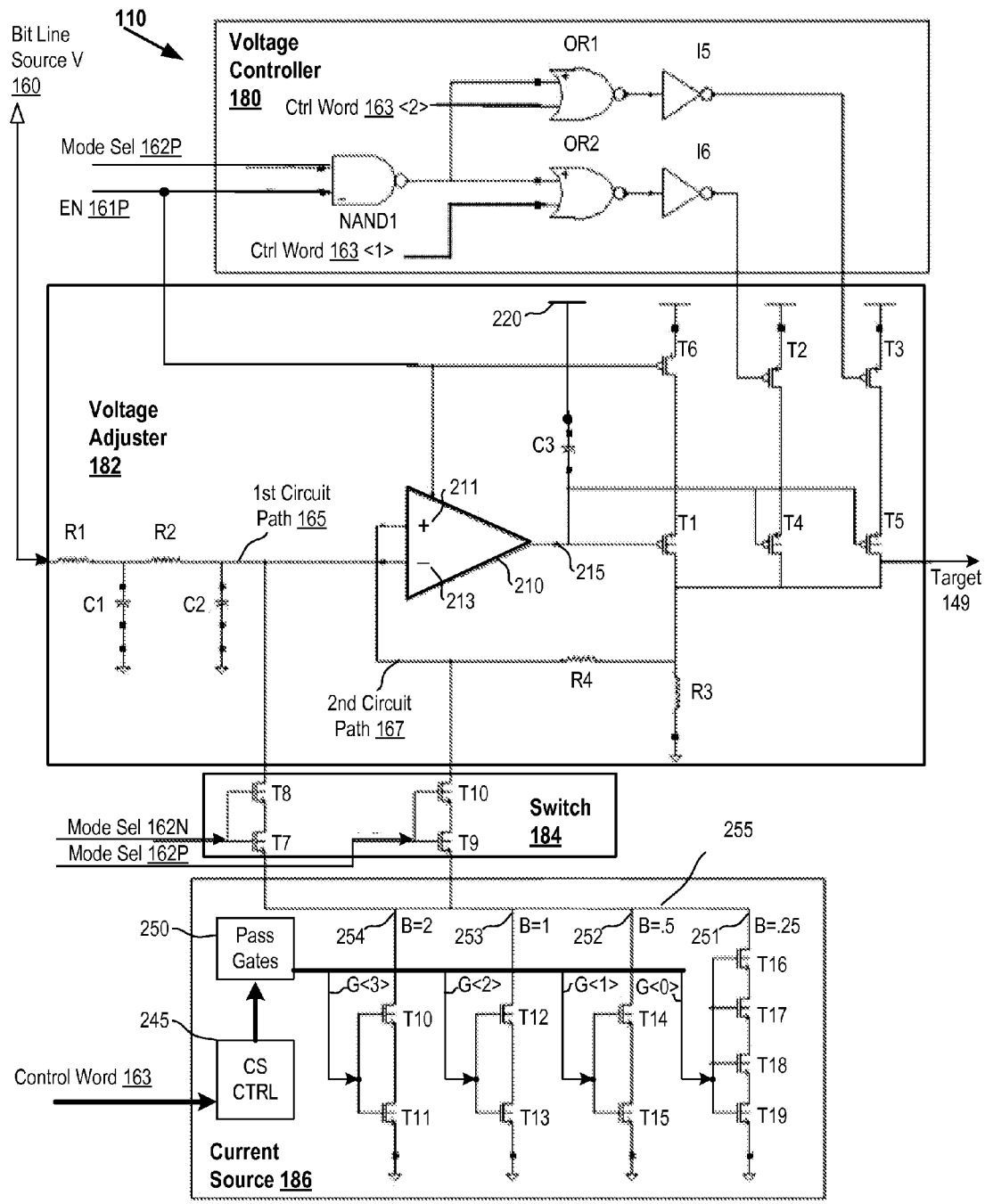
FIG. 2 shows an exemplary embodiment of an adjustable voltage generator in accordance with aspects of the invention.

FIG. 2 shows an exemplary embodiment of the adjustable voltage generator 110 in accordance with aspects of the invention. The adjustable voltage generator 110 includes the voltage controller 180, the voltage adjuster 182, the switch 184, and the current source 186, which can be the same or similar to the components shown in FIG. 1. The voltage adjuster 182 receives the bit line source voltage 160 and outputs the target voltage 149. Based on the enable signal 161, the mode select signal 162, and the control word signal 163, the voltage adjuster 182 selectively outputs the target voltage 149, which can be incrementally higher or lower than the bit line source voltage 160. As discussed previously, the target voltage 149 serves as a reference voltage for the bit line restore voltage 150 such that the bit line restore voltage 150 can be set at a level that is proportionally greater than or less than the bit line source voltage 160 by an offset.

In embodiments, the voltage adjuster 182 includes resistors R1, R2, R3, and R4, capacitors C1, C2, and C3, transistors T1, T2, T3, T4, T5, and T6, and operational amplifier 210. The operational amplifier 210 can be a conventional operational amplifier having a non-inverting input 211 ("+"), and inverting input 213 ("−") and an output 215. The inverting input 213 is connected to the bit line source voltage 160 via resistor R1 and/or resistor R2. The non-inverting input 211 is connected in a feedback loop to the output 215 via the feedback resistor R4 and the output transistor T1. As described below, the transistors T4 and T5 can be selectively added to the feedback loop by the voltage controller 180 using transistors T2 and T3 based on the mode select signal 162 and/or the control word signal 163. Additionally, the enable signal 161 can be connected to a power supply of the operational amplifier 210 to turn on/off the operational amplifier 210.

The operational amplifier 210 actively changes the voltage at output 215 to keep the voltage at the non-inverting input 211 and the inverting input 213 the same. By doing so, the operational amplifier 210 pulls the target voltage 149 up or down depending on the voltage at the non-inverting input 211 and the inverting input 213. As such, the target voltage 149 generated by the voltage adjuster 182 can be set higher or lower than the bit line source voltage 160. More specifically, the operational amplifier 210 receives bit line source voltage 160 at the inverting input 213 through resistors R1 and R2. Capacitors C1 and C2 can be included to filter noise that may be present in the bit line source voltage 160. Additionally, transistors T1, T4 and T5 are connected in parallel between the output 215 of the operational amplifier 210 and the non-inverting input 211, which forms a negative feedback circuit. Transistors T6, T2, and T3 are respectively linked in series to transistors T1, T4 and T5 to selectively connect transistors T1, T4 and T5 to a voltage source 220. Thus, the enable signal 161, the mode select signal 162, and the control word signal 163 can connect transistors T1, T4 and T5 to the output 215 of the operational amplifier 210 using transistors T6, T2, and T3.

The switch 184 and the current source 186 control the voltage adjustor 182 to increase or decrease the target voltage 149 by drawing current through one of first circuit path 165 or second circuit path 167. The switch 184 includes a first set of transistors T7 and T8 that connects the first circuit path 165 to the current source 186, which increases the target voltage 149. Additionally, the switch 184 includes a second set of transistors T9 and T10 that connects the second circuit path 167 to the current source 184, which decreases the target voltage 149. The mode select signal 162 selects the first circuit path 165 including the resistors R1 and R2 using the transistors T7 and T8 (e.g., Mode Sel_N=1 and Mode Sel_P=0) to enable a lower target voltage 149 output. The mode select signal 162 selects the second circuit path 167 including the negative feedback circuit including the resistor R4 and the transistor T1 using the transistors T9 and T10 (e.g., Mode Sel_N=0 and Mode Sel_P=1) to enable a higher target voltage 149. As shown in FIG. 2, the mode select signal 162 is provided as two complementary signals, mode select signal 162N and mode select signal 162P.

In operation, enabling the first circuit path 165 of the voltage adjuster 182 via the switch 184 produces a current flow that creates a voltage drop across the resistors R1 and/or R2 to cause the operational amplifier 210 to generate the target voltage 149 at a lower voltage than the bit line source voltage 160. In embodiments, the first circuit path 165 includes the resistor R1 and/or the resistor R2 that connect the bit line source voltage 160 to the inverting input 213 of the operational amplifier 210. When the mode select signal 162 (i.e., mode selection 162N) activates transistors T7 and T8 in the switch 184, current set by the current source 186 is drawn through resistor R1 and/or resistor R2 that incrementally lowers the inverting input 213 of the operational amplifier 210 (e.g., by 50 mV increments). This causes a rise in the voltage of the operational amplifier 210 that reduces current into the output node 215. Accordingly, the operational amplifier 210 reduces the voltage across output resistor R3 to equate it to that of the inverting input 213, which results in a decrease of the target voltage 149.

Enabling the second circuit path 167 via the switch 184 produces a current flow in the current source 186 that generates the target voltage 149 at a higher voltage than the bit line source voltage 160. In embodiments, the second circuit path includes the feedback loop from the output 215, through the transistor T1 and the resistor R4, to the inverting input 213 of the operational amplifier 210. When the mode select signal 162 (i.e., mode selection 162P) enables transistors T9 and T10, currents set by the current source 186 are drawn through the feedback resistor R4. This causes an offset voltage from the output node 215 to the non-inverting input 211 (e.g., by 50 mV increments). Accordingly, the operational amplifier 210 adjusts the output 215 to increase the current such that the output voltage 215 lowers to equalize the non-inverting input 211 and the inverting input 213. This increases the voltage across the output resistor R3, and increases the target voltage 149.

Still referring to FIG. 2, in embodiments the current source 186 is a current digital-to-analog circuit (I-DAC) that includes pass gates 250, current paths 251 . . . 254, and a common rail 255. The current paths 251 . . . 254 can carry the current drawn through the switch 184 by the current source 186 from the voltage adjuster 182. Each one of current paths 251 . . . 254 is individually activated by a corresponding one of pass gates 250. The pass gates 250 receive the control word signal 163 having bits <0> . . . <3>, that correspond to respective gate inputs G<0> . . . G<3>. As such, different combinations of current paths 251 . . . 254 can be selected by the control word signal 163 to select different current draws though the current source 186. That is, the current source 186 receives the control word signal 163, which digitally controls the gate voltages G<0> . . . G<3> to turn on/off the current paths 251 . . . 254 individually. In accordance with aspects of the invention, each of the current paths 251 . . . 254 is a current source that is selectable and has respective current gains (e.g., beta ratios (B) of 0.25, 0.5, 1 and 2.) In this embodiment the current flowing through common rail 255 can be adjusted in increments proportional to the beta ratios of the individual current sources within current paths 251 . . . 254. In embodiments with the beta ratios increasing in a binary weight, i.e. 1, 2, 4, 8 . . . and so on, current levels can be adjusted from a minimum current level to a maximum level in increments of the smallest current level dictated by the smallest beta ratio. Thus, a binary weighted current will flow through the common rail 255 to ground as a function of digital control word signal 163.

According to aspects of the invention, the voltage controller 180 is structured and arranged to selectively control the voltage adjustor 182 to keep the operational amplifier 210 operating in a linear operation mode based on the current selected for the current source 186 by the control word signal 163. As is understood by those of ordinary skill in the art, the accuracy of operational amplifier circuits can be degraded by the source/drain modulation effect. Whereas the output of an ideal operational amplifier would be independent of output voltage, in application, the accuracy of operational amplifier circuits can suffer as the gate-source voltage (i.e., Vg/s) of the output transistors changes. This problem is minimized by maintaining the output transistor in a low overdrive state. Thus, in accordance with aspects of the invention, the voltage controller 180 modulates the effective device beta of the output transistor T1 by selectively including additional output transistors T4 and T5 in the feedback loop of the operational amplifier 210. Thus, the voltage controller 180 increases the effective device beta as current source 186 settings cause it to draw more current. More specifically, the voltage controller 180 receives the control word signal 163 or a part thereof (e.g., the two most significant bits, i.e. "CRTL Word <1>" and "CTRL word <2>"). In embodiments, the control word signal 163 is logically combined with the mode select signal 162 (i.e., "Mode Sel 162") and the enable signal 161 (i.e., "EN 161P") by NAND-gate NAND1, OR-gates OR1 and OR2, and inverters I5 and I6 to selectively activate transistor T4 and T5. Thus, when the control word signal 163 selects for higher current to be drawn by the current paths 251 . . . 254 of the current source, the voltage controller 180 can selectively add transistors T4 and T5 in parallel with the output transistor T1. This keeps the selected output transistor's overdrive in a range (e.g., 150 mV to 250 mV), which maintains a preferred operating range that improves the linear operation of the operational amplifier 210. As shown in FIG. 2, there are three output transistors T1, T4, and T5). However, any number of output transistors may be included in embodiments of the invention.

Figure 3:
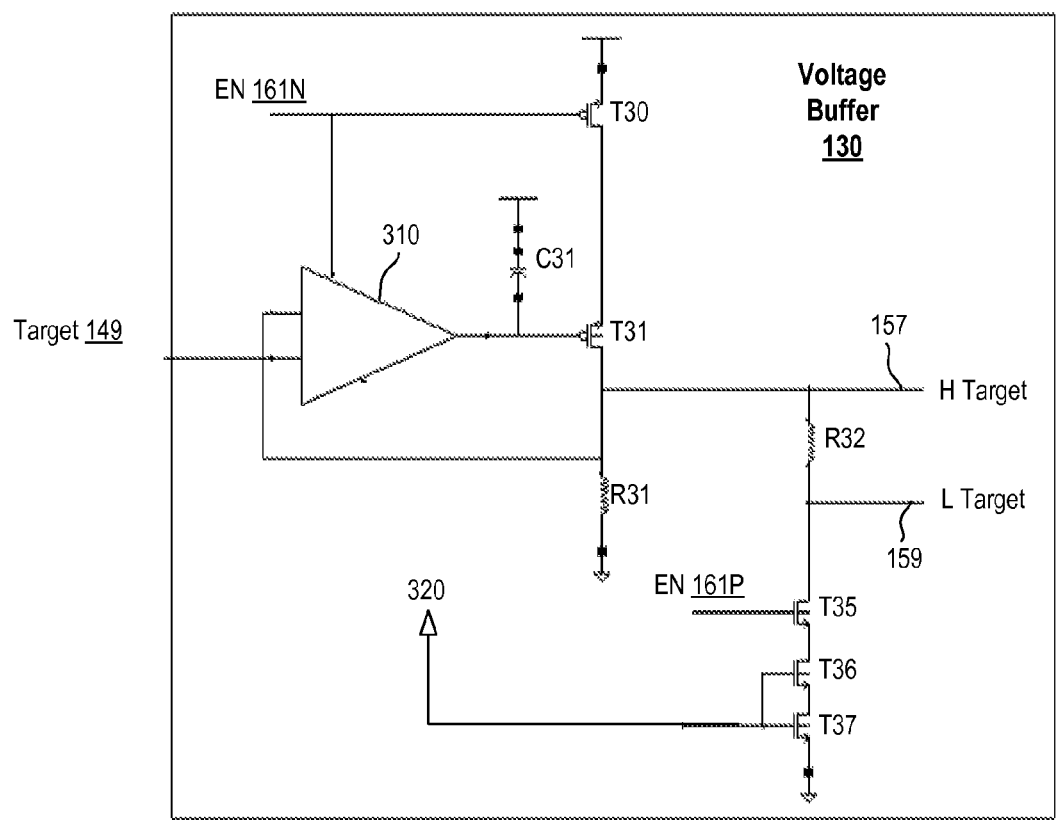
FIG. 3 shows an exemplary voltage buffer in accordance with aspects of the present invention.

FIG. 3 shows an exemplary voltage buffer 130 in accordance with aspects of the present invention. Voltage buffer 130 in FIG. 3 may be the same or similar to that shown in FIG. 1. As noted previously, the voltage buffer 130 receives the target voltage 149 as an input, and outputs the high target voltage 157 and the low target voltage 159. In embodiments, the voltage buffer 130 can also receive the enable signal 161 (i.e., "EN 161P") and/or the complement of the enable signal 161 (i.e., "EN 161N") that can be used to activate/deactivate the voltage buffer 130 via transistors T30 and T35. In embodiments, the voltage buffer 130 includes a buffer operational amplifier 310, which is configured as a unity gain amplifier, wherein the voltage across output resistor R31 is maintained by a feedback loop, including capacitor C31 and transistor T31. As such, the high target voltage 157 is essentially equal to the target voltage 149 output by the adjustable voltage generator 110. In accordance with aspects of the invention, the low target voltage 159 has a voltage that is linearly offset from the high target voltage 157 by a predetermined amount due to the voltage drop across resistor R32. The offset of the low target voltage 159 can be achieved by drawing a reference current through resistor R32 and transistors T36 and T37 based on a reference current-source control-voltage 320. For example, the low target voltage 159 can be offset 20 mV lower than the high target voltage 157.

Figure 4:
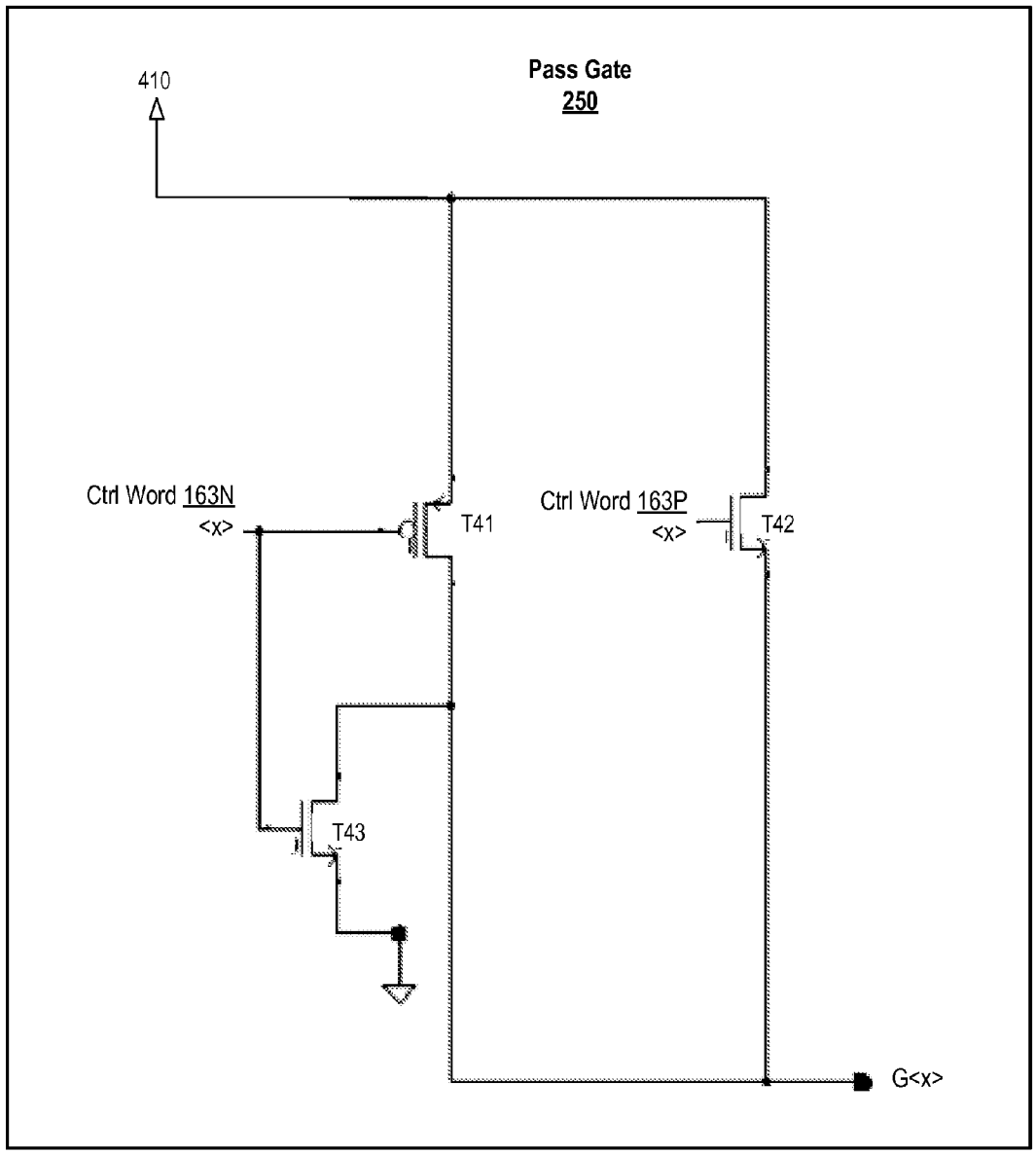
FIG. 4 shows an exemplary pass gate in accordance with aspects of the invention.

FIG. 4 shows an exemplary pass gate 250 in accordance with aspects of the invention. The pass gate 250 can be an instance of the pass gates shown in FIG. 2. In embodiments, there is one pass gate for each current path (e.g., current paths 251-254) that establishes currents in the current source 186 based on the control word signal 163 by selectively activating a gate (e.g., G<0> . . . G<3>) of a corresponding current path (e.g., current paths 251 . . . 254). In embodiments, the pass gate 250 includes transistors T41, T42, and T43. A reference current-source control-voltage 410 is input to the pass gate 250. When the pass gate 250 is selected by the control word signal 163 (e.g., control word signal 163N <x>=0 and complementary control word signal 163P <x>)=1), the pass gate 250 output voltage G<x> is at the reference voltage 410 level via transistors T41 and T42 (wherein "x" is a value between 0 and 3 denoting one of gates G<0> . . . G<3>). When the pass gate 250 is not selected by the control word signal 163, the voltage G<x> is clamped to ground voltage via transistor T43 such that the pass gate 250 turns off the corresponding one of the current paths.

Figure 5:
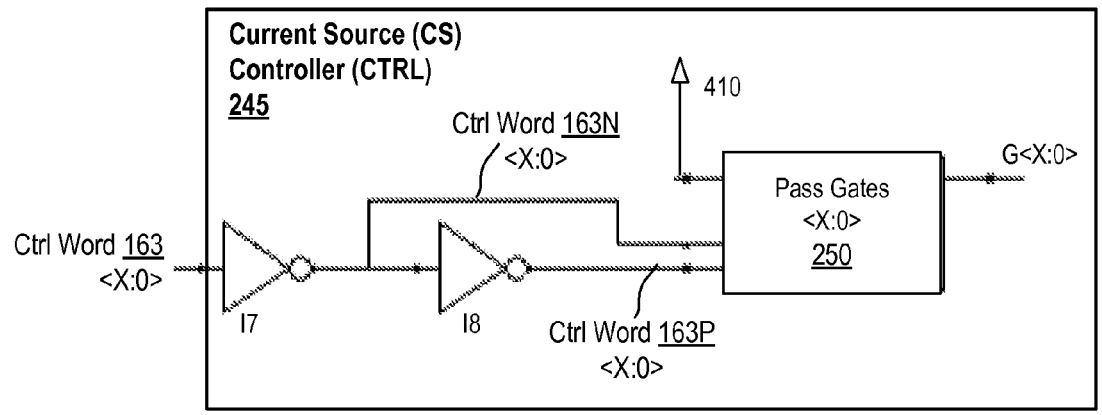
FIG. 5 shows an exemplary current source controller 245 in accordance with aspects of the invention.

FIG. 5 shows a current source controller 245 in accordance with aspects of the invention. The current source controller 245 may be the same or similar to that shown in FIG. 2. In embodiments, the current source controller 245 provides control word signal 163N and control word signal 163P to the pass gates 250 based on the received control word signal 163 (e.g., from configuration logic 105). The control word signal 163 can include a number of bits (i.e., "X," which is a positive integer number), wherein each bit corresponds to a respective one of pass gates 250. Thus, in an embodiment having four pass gates <0>, <1>, <2>, and <3> (i.e., "<3:0>"), the control word signal 163 would include corresponding bits <0>, <1>, <2>, and <3> (i.e., "<3:0>"), wherein bit <3> is the most significant bit. Based on the content of the control word signal 163, the current source controller 245 outputs current source control signals to the pass gates 250 for incrementally controlling the target voltage output of the voltage adjuster 182. The control word signal 163 signals include control word signal 163P, which is the same polarity as the control word signal 163, and control word signal 163N, which is the complement of the control word signal 163.

Figure 6:
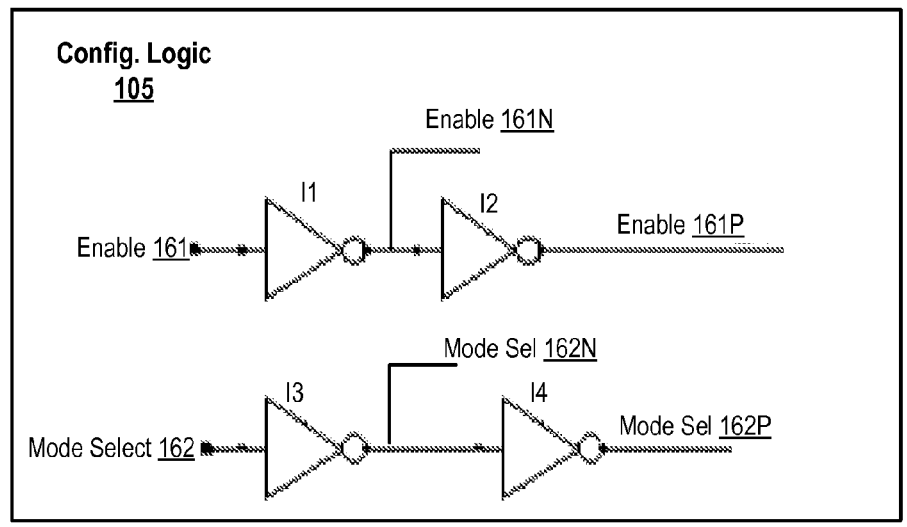
FIG. 6 shows exemplary configuration logic 105 in accordance with aspects of the invention.

FIG. 6 shows exemplary configuration logic 105 in accordance with aspects of the invention. The configuration logic provides the enable signal 161N, the enable signal 161P, the mode select signal 162N, and the mode select signal 162P based on the enable signal 161 and the mode select signal 162. The configuration logic 105 can receive the enable signal 161 and the mode select signal 162 from for example, a storage device (e.g., storage device 170). The values of the enable signal 161 and/or the mode select signal 162 can be stored in the storage device by an individual or an automated program based on post-manufacturing and/or installed system testing.

Figure 7:
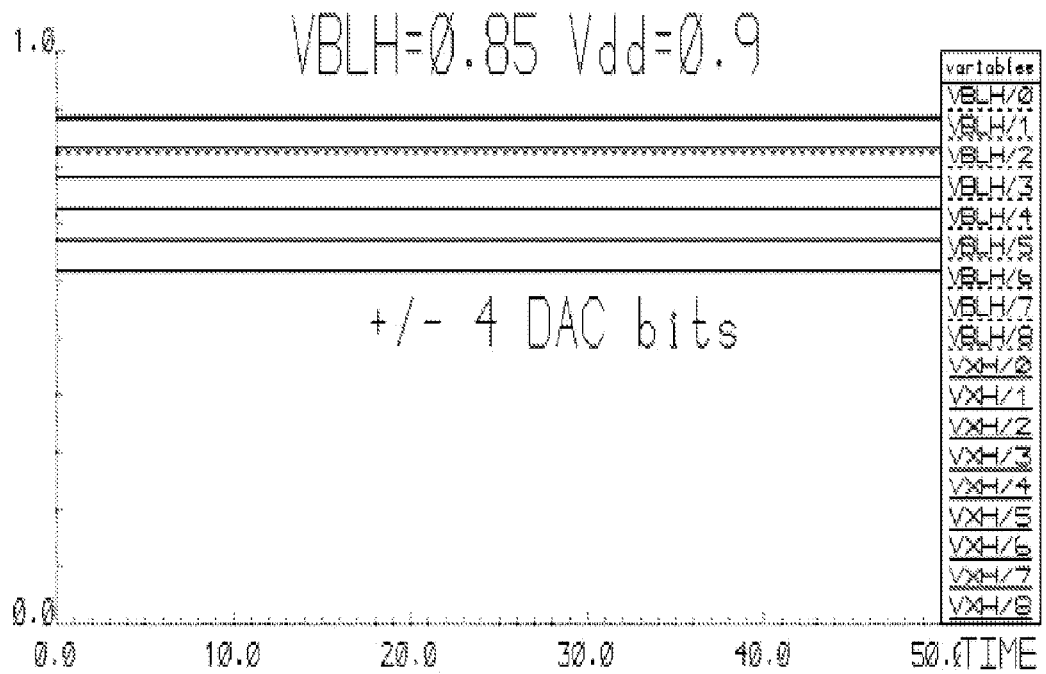
FIG. 7 shows an exemplary plot of a bit line restore voltage in accordance with aspects of the invention.
Figure 8:
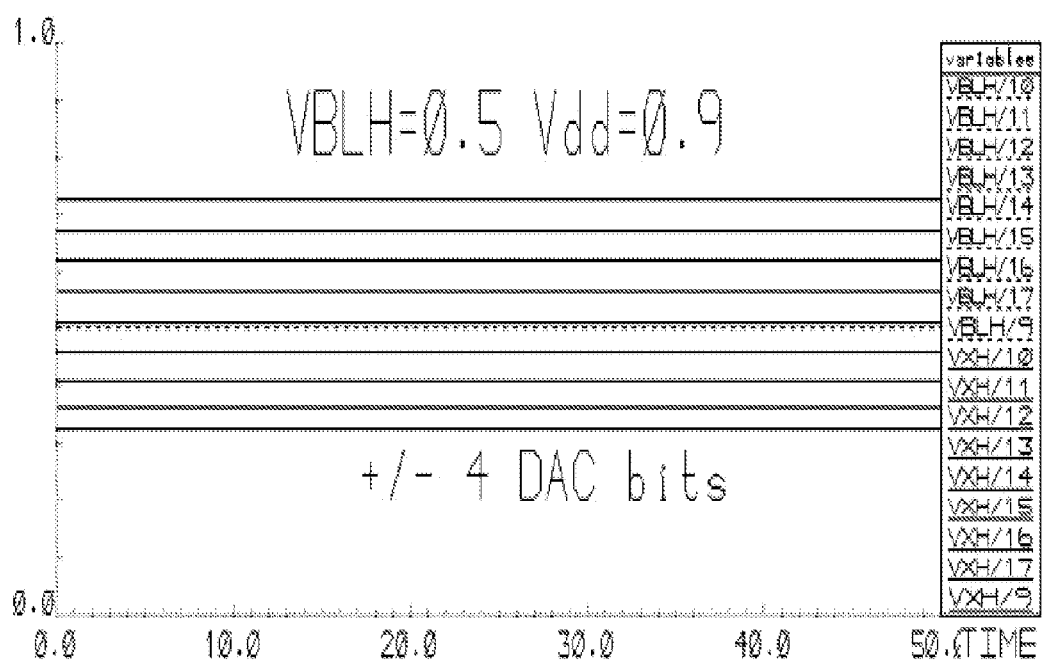
FIG. 8 shows an exemplary plot of a bit line restore voltage in accordance with aspects of the invention.
Figure 9:
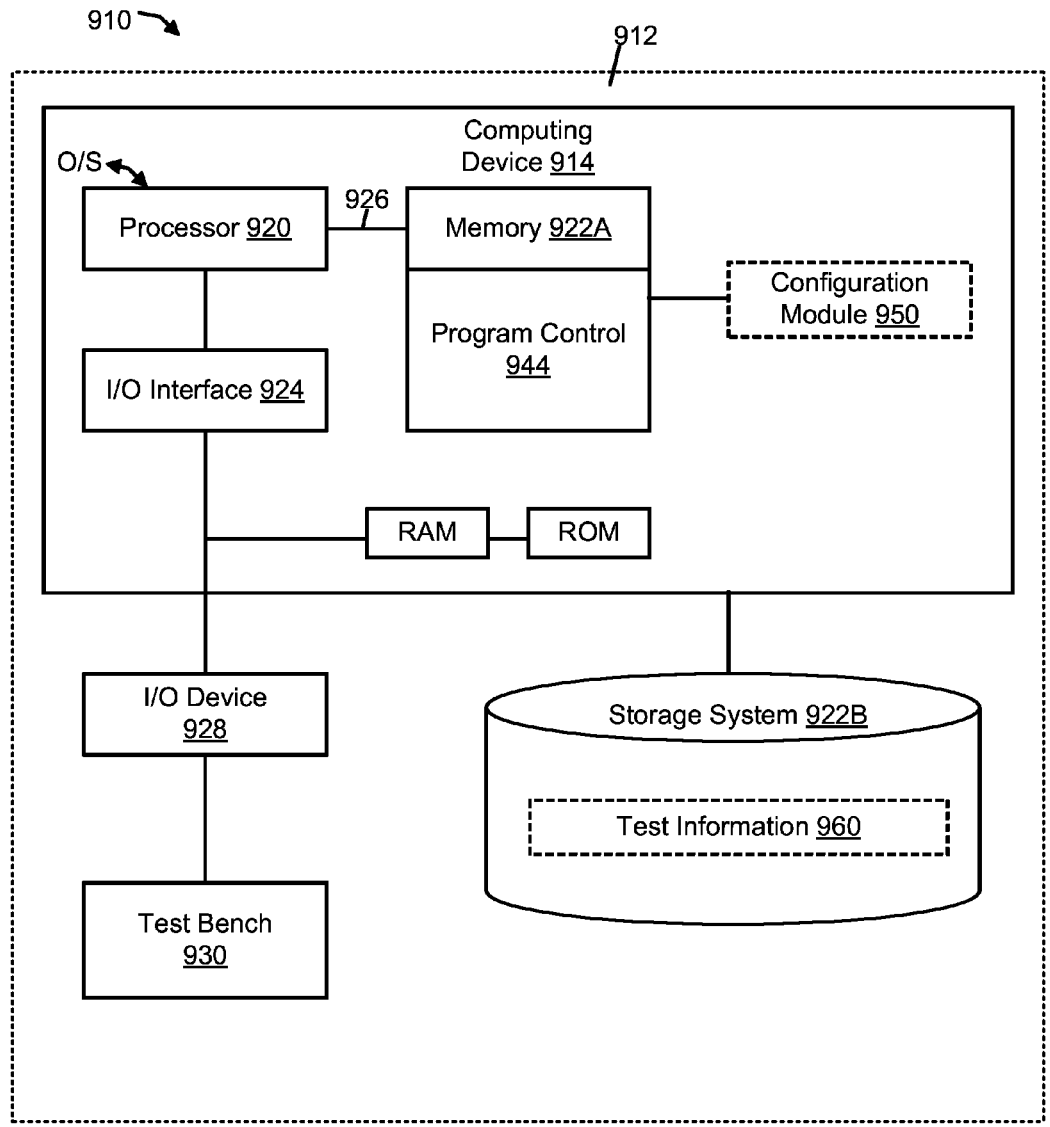
FIG. 9 shows an exemplary environment for implementing steps in accordance with aspects of the invention.

FIG. 7 shows an exemplary plot of the high target voltage (e.g., high target voltage 157, labeled "VXH") as control word 163 calls for an increase, and a decrease of four 50 mV steps. In this example power supply voltage (e.g., voltage source 220, labeled "Vdd") is set at 0.9 V, and bit line source voltage (e.g., bit line source voltage 160, labeled "VBLH") is set to 0.85 V. Four decreasing values of the high target voltage are shown, and one high target voltage that is 50 mV higher than the bit line source voltage is shown. Higher settings for the high target voltage are unresponsive because the settings are above the circuit power supply, which is 0.9 V in this example. Higher settings are possible if the voltage of a power supply is increased, or if the bit line source voltage is reduced. FIG. 8 shows an exemplary plot of the high target voltage with the bit line source voltage set to 0.5V. Four increased and decreased settings are shown with 50 mV per step resolution when the power source is set at 0.9 V FIG. 9 shows an exemplary environment 910 for implementing the steps in accordance with aspects of the invention. To this extent, the environment 910 includes a server or other computing infrastructure 912 that can perform the processes described herein. In particular, the computer infrastructure 912 includes a computing device 914. The computing device 914 can be resident on a network infrastructure or computing device of a third party service provider (any of which is generally represented in FIG. 9).

The computing device 914 also includes a processor 920, memory 922A, an I/O interface 924, and a bus 926. The memory 922A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 914 is in communication with the external I/O device 928 and a storage system 922B. For example, the I/O device 928 can comprise any device that enables an individual to interact with the computing device 914 (e.g., user interface) or any device that enables the computing device 914 to communicate with one or more other computing devices using any type of communications link. The external I/O device/resource 928 may be for example, a handheld device, PDA, handset, keyboard etc. Test bench 930 is a system for performing post manufacturing, verification testing of DRAM devices (e.g., DRAM 100). Alternatively, test bench 930 is a system for performing installed system testing of the DRAM.

In general, processor 920 executes computer program code (e.g., program control 944), which can be stored in the memory 922A and/or storage system 922B. Moreover, in accordance with aspects of the invention, program control 944 controls a configuration module 950 to perform one or more of the processes described herein. Configuration module 950 can be implemented as one or more sets of program code in the program control 944 stored in memory 922A as separate or combined modules. Additionally, configuration module 950 can be implemented as separate dedicated processors or a single or several processors to provide the function of these tools.

While executing the computer program code, the processor 920 can read and/or write data to/from memory 922A, storage system 922B, and/or I/O interface 924. The program code executes the processes of the invention, for example, configuration module 950. Further, data read and/or write data to/from the memory 922A, storage system 922B and/or I/O interface 924 may include test information 960. Bus 926 provides a communication link between each of the components in computing device 914.

In accordance with aspects of the invention, configuration module 950 is computer program code stored in, for example, memory 922A and/or storage system 922B that, when executed by the processor 920, causes computing device 914 to provide settings for configuring the DRAM in accordance with aspects to the invention using, for example, test bench 930 or some other device that provides an interface between the computing device 914 and the DRAM. In embodiments, an individual and/or software logic determine in incremental voltage by which a bit line restore voltage (e.g., bit line restore voltage 150) should be increased or decreased such that it is the same as a switch-point voltage of a single-ended sense device (e.g., sense device 120). The settings (e.g., enable, mode select, and control word) can be stored in configuration logic (e.g., configuration logic 105) of the DRAM.

The computing device 914 can comprise any general purpose computing article of manufacture capable of executing computer program code installed thereon (e.g., a personal computer, server, etc.). However, it is understood that the computing device 914 is only representative of various possible equivalent-computing devices that may perform the processes described herein. To this extent, in embodiments, the functionality provided by the computing device 914 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 912 is only illustrative of various types of computer infrastructures for implementing the invention. For example, in embodiments, the computing infrastructure 912 comprises two or more computing devices (e.g., a server cluster) that communicate over any type of communications link, such as a network, a shared memory, or the like, to perform the process described herein. Further, while performing the processes described herein, one or more computing devices on computing infrastructure 912 can communicate with one or more other computing devices external to computing infrastructure 912 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 10:
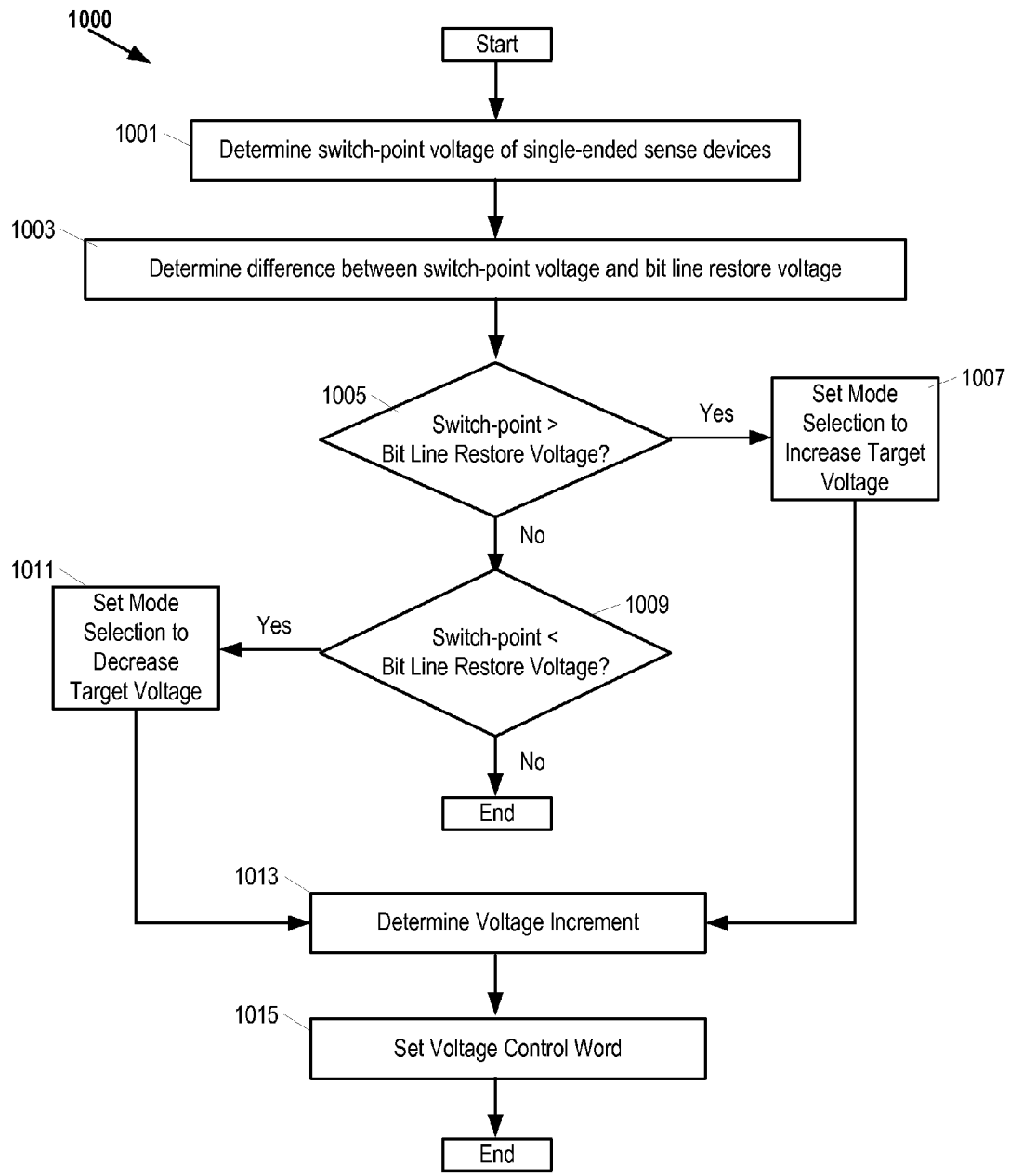
FIG. 10 shows an exemplary process flow for performing aspects of the present invention.

FIG. 10 shows an exemplary process flow 1000 for performing aspects of the present invention. The steps of FIG. 10 can be implemented in the environment of FIG. 9 to configure the DRAM of FIGS. 1-8.

The flowchart in FIG. 10 illustrates the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 10 depicts an exemplary process flow 1000 for adjusting a bit line restore voltage (e.g., bit line restore voltage 150) in accordance with aspects of the invention. At step 1001, an individual (e.g., a test engineer) and/or an automated process (e.g., configuration module 950) determines the switch-point voltage of one or more sense devices in a DRAM (e.g., sense device 120 in DRAM 100). In embodiments, the individual or the automated process determines the switch-point voltage through post-manufacturing electrical testing on the DRAM (e.g., using test bench 930). Additionally or alternatively, logic in the DRAM can monitor operational conditions and estimate a current switch-point voltage. For example, based on incremental changes in an operating temperature of the DRAM, the logic can offset an initial switch-point voltage of the DRAM by corresponding amounts.

At step 1003, the individual and/or automated process determines a difference between the switch-point voltage determined in step 1001 and a bit line restore voltage (e.g., bit line restore voltage 150) of a global bit line (e.g., global bit line 151) corresponding a single-sided sense device of the DRAM (e.g., sense device 120). At step 1005, if it is determined based on the difference determined at step 1003 that the switch-point voltage is greater than the bit line restore voltage, than at step 1007, then the individual and/or automated process sets a value of a mode selection signal (e.g., mode selection signal 162) to increase a target voltage (e.g., target voltage 149) output by a voltage adjuster (e.g., adjustable voltage controller 110). Otherwise, at step 1009, if it is determined based on the difference determined at step 1003 that the switch-point voltage is less than the bit line restore voltage, then at step 1011, the individual or automated process sets a value for the mode selection signal to decrease the target voltage output by the voltage adjuster. In embodiments, setting a value of a mode selection includes storing a value in non-volatile memory associated with the DRAM (e.g., in storage device 170 of configuration logic 105). Otherwise, if steps 1005 and 1009 result in a determination that the switch-point voltage is neither greater than nor less than the bit line restore voltage (i.e., the switch-point voltage and the bit line are equal), then the process 1000 ends.

At step 1013, the individual and/or automated process determines a voltage increment for adjusting the target voltage output by a voltage adjuster based on the difference determined at step 1003. The increment can be one selected from set of predetermined voltage increments (e.g., ±0.25 mV, ±0.50 mV, ±0.75 mV, ... ±5.0 mV) that most closely matches the difference determined at step 1003. In embodiments, the determined increment corresponds to a particular combination of paths (e.g., paths 251-254) of a current source (e.g., current source) equal (at least approximately) the differences.

At step 1015, the individual and/or automated process sets a control word signal (e.g., control word signal 163) corresponding to the increment determined at step 1013. Based on the control word signal, the DRAM adjusts the target voltage output by the voltage adjuster, which changes the bit line restore voltage of the single-ended sense device. For example, to adjust the target voltage by a particular increment (e.g., 0.25 V), the individual or automated process may store values for a controller for a control word signal (e.g., 0001) in a non-volatile memory device (e.g., configuration logic 105) in the DRAM. The process 1000 then ends. Although, in some embodiments, the process 1000 can be iteratively repeated to dynamically adjust the target voltage during operation of the DRAM in a fielded device.

As described above, in accordance with aspects of the invention, a circuit incrementally adjusts a bit line restore voltage that pre-charges a global bit line of a DRAM including a single-sided sense device. By doing to, the individual and/or the automated process can use the circuit to tune the bit line restore voltage to match up the switch-point voltage of the sense device to the range of input data signals. Thus, variations in switch-point voltage are accommodated, which results in more accurate and reliable DRAMs. Further, an increase in production yield is achieved by reducing the number of DRAMs that may otherwise be considered faulty due to deviations in the switch-point voltages of sense devices included in the DRAM.

Figure 11:
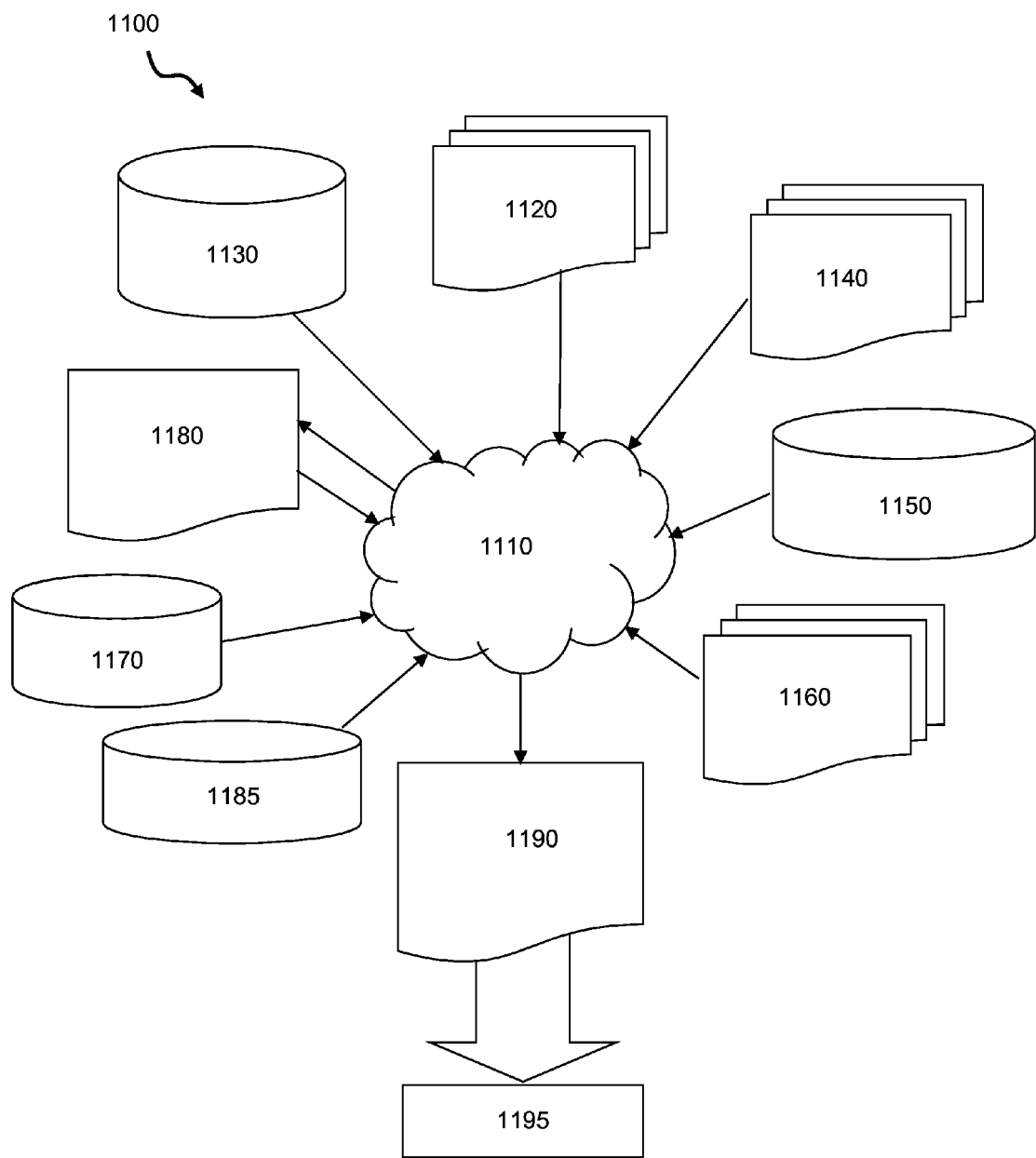
FIG. 11 shows a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 1100 used for example, in semiconductor IC logic design, simulation, test, layout, and manufacture. Design flow 1100 includes processes, machines and/or mechanisms for processing design structures or devices to generate logically or otherwise functionally equivalent representations of the design structures and/or devices described above and shown in FIGS. 1-6. The design structures processed and/or generated by design flow 1100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 1100 may vary depending on the type of representation being designed. For example, a design flow 1100 for building an application specific IC (ASIC) may differ from a design flow 1100 for designing a standard component or from a design flow 1100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1120 that is preferably processed by a design process 1110. Design structure 1120 may be a logical simulation design structure generated and processed by design process 1110 to produce a logically equivalent functional representation of a hardware device. Design structure 1120 may also or alternatively comprise data and/or program instructions that when processed by design process 1110, generate a functional representation of the physical structure of a hardware device. Whether representing functional and/or structural design features, design structure 1120 may be generated using electronic computer-aided design (ECAD) such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device, or system such as those shown in FIGS. 1-6. As such, design structure 1120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1110 preferably employs and incorporates hardware and/or software modules for synthesizing, translating, or otherwise processing a design/simulation functional equivalent of the components, circuits, devices, or logic structures shown in FIGS. 1-6 to generate a netlist 1180 which may contain design structures such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an iterative process in which netlist 1180 is resynthesized one or more times depending on design specifications and parameters for the device. As with other design structure types described herein, netlist 1180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1110 may include hardware and software modules for processing a variety of input data structure types including netlist 1180. Such data structure types may reside, for example, within library elements 1130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1140, characterization data 1150, verification data 1160, design rules 1170, and test data files 1185 which may include input test patterns, output test results, and other testing information. Design process 1110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1110 without deviating from the scope and spirit of the invention. Design process 1110 may also include modules for performing standard circuit design processes such as timing analysis, verification, design rule checking, place and route operations, etc.

Design process 1110 employs and incorporates logic and physical design tools such as HDL compilers and simulation model build tools to process design structure 1120 together with some or all of the depicted supporting data structures along with any additional mechanical design or data (if applicable), to generate a second design structure 1190.

Design structure 1190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1120, design structure 1190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 1190 may comprise a compiled, executable HDL simulation model that functionally simulates the devices shown in FIGS. 1-6.

Design structure 1190 may also employ a data format used for the exchange of layout data of integrated circuits and/or symbolic data format (e.g. information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 1190 may then proceed to a stage 1195 where, for example, design structure 1190: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit for generating a target reference voltage, comprising:
    a voltage adjuster;
    a switch; and
    a current source,
    wherein:
        the switch selectively connects the current source to one of a plurality of circuit paths in the voltage adjuster;
        a first circuit path of the plurality of circuit paths incrementally decreases the target reference voltage with respect to an input voltage; and
        a second circuit path of the plurality of circuit paths incrementally increases the target reference voltage with respect to the input voltage.

2. The circuit of claim 1, wherein:
    the voltage adjuster comprises an operational amplifier having a non-inverting input, an inverting input, and an output;
    a feedback loop connects the output to the non-inverting input to the output;
    the feedback loop includes an output transistor and a feedback resistor; and
    the inverting input connects to the input voltage via one or more input resistors.

3. The circuit of claim 2, wherein the first circuit path comprises the one or more resistors that connect the input voltage to the inverting input of the operational amplifier.

4. The circuit of claim 2, wherein the second circuit path comprises the feedback loop including the output transistor and the feedback resistor.

5. The circuit of claim 2, wherein the current source comprises a current digital-to-analog converter.

6. The circuit of claim 5, wherein the current digital-to-analog converter includes a plurality of individually activatable current paths.

7. The circuit of claim 5, wherein a width of the output transistor varies based on which of a plurality of individually activatable current paths are selected for activation.

8. The circuit of claim 1, further comprising a voltage buffer connected to an output of the voltage adjuster, wherein the voltage buffer outputs a high voltage that is equal to the target reference voltage and a low voltage that is less than the high voltage by a predetermined offset.

9. The circuit of claim 8, further comprising a voltage regulator that generates a bit line restore voltage for a single-ended sense device based on the high voltage and the low voltage.

10. The circuit of claim 1, further comprising a dynamic random access memory comprising a plurality of memory cells having a common local bit line; wherein:
    the common local bit line is connected to a global bit line through an isolator;

the isolator selectively links the common local bit line to a single-ended sense device through the global bit line;

a bit line restore voltage is connected to the global bit line, and the bit line restore voltage is generated from the target reference voltage.

11. A circuit for a DRAM comprising:

one or more devices configured to increase and decrease an output reference voltage provided to a single-ended sense device of a memory cell array, wherein:

the one or more devices include an operational amplifier coupled to a current source having a plurality of selectable current increments; and the operational amplifier increases or decreases the output reference voltage based on which of the plurality of current increments are selected.

12. The circuit of claim 11, wherein the operational amplifier includes a first input coupled to an input reference voltage, and a second input coupled to a feedback path.

13. The circuit of claim 12, wherein:

the current source is a current digital-to-analog converter;

the first input is coupled to the current digital-to-analog converter by a switch when the switch is in a first mode;

the second input is coupled to the current digital-to-analog converter by the switch when the switch is in a second mode; and the switch selectively switches between the first mode and the second mode to adjust said output reference voltage lower or higher than the input reference voltage.

14. The circuit of claim 13, wherein the current digital-to-analog converter incrementally adjusts the input reference voltage in a plurality of steps.

15. The circuit of claim 14, wherein the circuit further comprises a plurality of parallel field effect transistor devices that are included in the feedback path based on which of the plurality of steps are selected.

16. A method comprising:

determining a difference between a switch-point voltage and an input voltage of a single-ended sense device;

determining a voltage increment for the input voltage based on the difference; and adjusting the input voltage based on the voltage increment.

17. The method of claim 16, wherein:

the determining the difference comprises determining that the switch-point voltage is greater than the input voltage; and the adjusting the input voltage comprises selecting a mode of an adjustor circuit that increases the input voltage.

18. The method of claim 16, wherein:

the determining the difference comprises determining that the switch-point voltage is less than the input voltage; and the adjusting the input voltage comprises selecting a mode of an adjustor circuit that decreases the input voltage.

19. The method of claim 16, wherein the adjusting the input voltage comprises storing a control word in a non-volatile memory device in a dynamic random access memory.

20. The method of claim 16, wherein the adjusting the input voltage comprises:

selecting a mode that switches between an increased voltage and a decreased voltage; and selecting one or more current paths that incrementally change the input voltage.

\* \* \* \* \*